United States Patent [19]

Shores

[11] Patent Number: 4,709,121
[45] Date of Patent: Nov. 24, 1987

[54] HINGE SEAL
[75] Inventor: Marvin W. Shores, Pomona, Calif.
[73] Assignee: General Dynamics, Pomona Division, Pomona, Calif.
[21] Appl. No.: 812,664
[22] Filed: Dec. 23, 1985
[51] Int. Cl.⁴ .............................................. H05K 9/00
[52] U.S. Cl. .................................. 174/35 R; 16/250; 16/365; 16/382
[58] Field of Search .......... 174/35 R, 35 MS, 35 GC; 219/10.55 D; 16/223, 250, 251, 221, 355, 356, 252, 365, 382

[56] References Cited

U.S. PATENT DOCUMENTS

| | | | |
|---|---|---|---|
| 603,042 | 4/1898 | Hoyt . | |
| 1,417,984 | 5/1922 | French | 16/355 |
| 1,606,047 | 11/1926 | Soss . | |
| 2,342,453 | 2/1944 | Colucci | 16/148 |
| 2,393,538 | 1/1946 | Ingalls et al. | 200/19 |
| 2,405,987 | 8/1946 | Arnold | 174/35 MS |
| 2,504,635 | 4/1950 | Bradley | 16/223 |
| 2,685,071 | 7/1954 | McCreary | 339/35 |
| 2,757,225 | 7/1956 | Dunn | 174/35 |
| 3,074,520 | 1/1963 | Grubelich | 189/36 |
| 3,104,415 | 9/1963 | Stocker | 16/137 |
| 3,296,356 | 1/1967 | McAdams | 174/35 |
| 3,413,406 | 11/1968 | Plummer | 174/3 |
| 3,651,540 | 3/1972 | Rana | 16/148 |
| 3,962,550 | 6/1976 | Kaiserswerth | 174/35 |
| 4,068,087 | 1/1978 | Ristig | 174/35 |
| 4,098,633 | 7/1978 | Kersten | 156/245 |
| 4,399,317 | 8/1983 | Van Dyk, Jr. | 174/35 |

FOREIGN PATENT DOCUMENTS 674465  11/1963  Canada .

Primary Examiner—Arthur T. Grimley
Assistant Examiner—David A. Tone
Attorney, Agent, or Firm—Neil F. Martin; Edward B. Johnson

[57] ABSTRACT

A seal for a piano hinge for preventing passage of electromagnetic energy through the hinge; said seal comprising a first sealing member of conductive material comprising a connecting section for attachment to and for electrical contact with one hinge leaf and an arcuate section shaped to fit over the hinge knuckles, and a second sealing member of conductive material comprising a connecting section for attachment to and for electrical contact with another hinge leaf and an arcuate section for overlapping and for making electrical contact with the arcuate section of the first sealing member. Preferably the sealing members are of hard copper alloy. Another embodiment includes a detachable sealed hinge assembly wherein the hinge includes three leaves; an attached leaf, an insertion leaf, and an attachable leaf.

16 Claims, 11 Drawing Figures

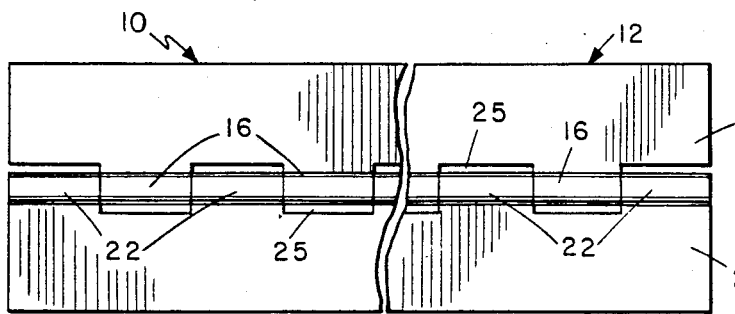
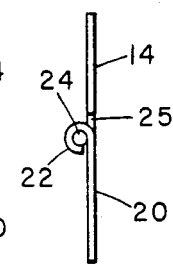
FIG. 1 PRIOR ART
FIG. 2 PRIOR ART
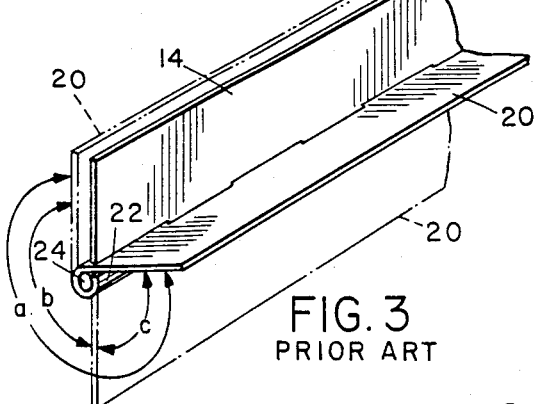
FIG. 3 PRIOR ART
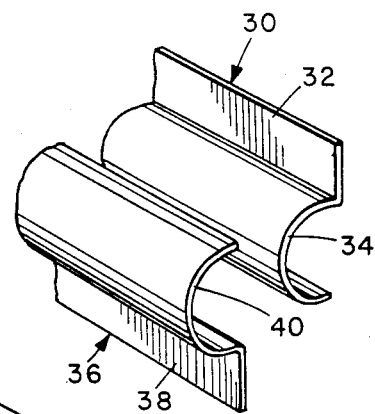
FIG. 4
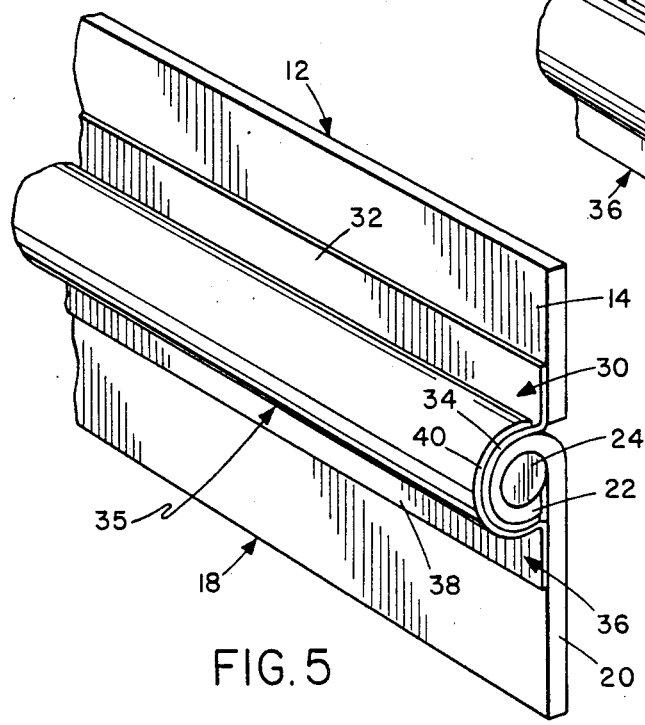
FIG. 5

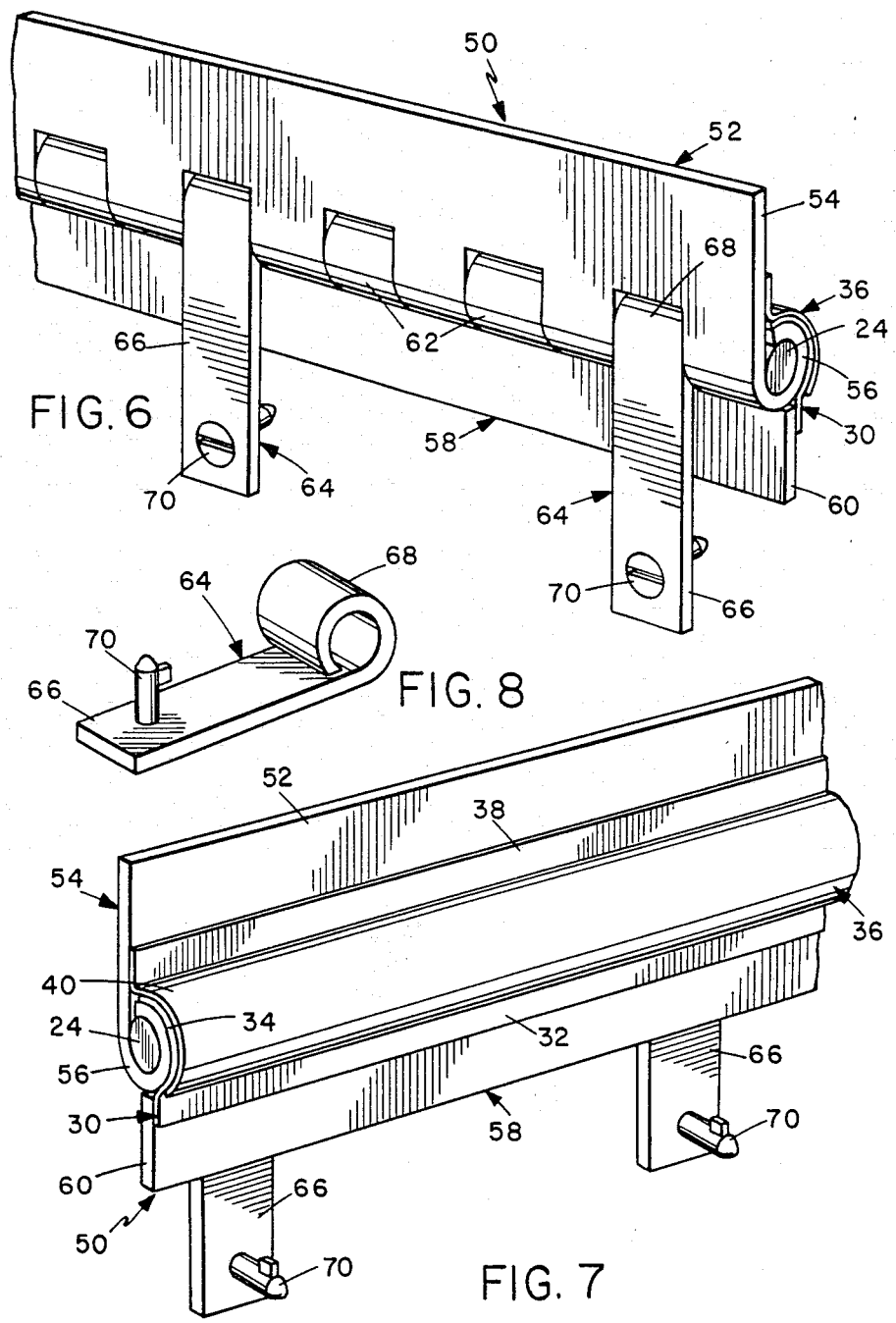

HINGE SEAL

BACKGROUND OF THE INVENTION

1. Field of the Invention

This invention relates in general to hinge seals for sealing hinges against passage of electromagnetic energy and more particularly involves sealing of a piano-type hinge.

2. Background of the Invention

In many applications it is necessary to enclose electronic components in shielded enclosures to prevent the ingress or egress of electromagnetic energy. Piano-type hinges are often advantageous on such enclosures for insertion and removal of components or to gain access to the components for repair. However, the typical piano hinge contains aperatures around the knuckle sections through which electromagnetic energy, particularly very high frequency waves, can pass. Therefore, it is desirable to have a reliable manner of sealing a piano hinge.

To best avoid the passage of electromagnetic radiation, the members joined by the hinge should be electrically connected. The typical piano hinge does not serve as a good means for electrically connecting the hinged members. Therefore, it would be desirable to have an improved piano hinge which effectively electrically connects the attached members.

Also, in many application, it is advantageous that one member joined by the hinge be easily separated from the other member joined by the hinge. Therefore, it is easily desirable to have a hinge assembly which is quickly and easily detachable.

SUMMARY OF THE INVENTION

This invention is a hinge seal from preventing passage of electromagnetic energy through a piano hinge, and it generally comprises: a first sealing member of conductive material having a connecting section for attachment to and for electrical contact with one hinge leaf and an arcuate section shaped to fit over the hinge knuckles; and a second sealing member of conductive material having a connecting section for attachment to and for electrical connection with another hinge leaf and an arcuate section for overlapping and making electrical contact with the arcuate section of the first sealing member.

An exemplary embodiment of the invention provides for a sealed detachable hinge for connecting first and second conductive members, the second conductive member having a slotted orifice. In this configuration the hinge assembly comprises an attached hinge member including; a leaf, and a knuckle section; the attached hinge leaf for structural and electrical connection to the first conductive member to be joined; a conductive insertion hinge member including; a leaf; and a knuckle section; the insertion hinge member leaf for insertion into a slotted orifice in a second conductive member to be joined for retaining the insertion hinge member leaf in the plane of the slotted orifice and for making electrical contact with the second conductive member; a conductive attachable hinge member including; a leaf; and a knuckle portion; the attachable hinge member leaf for removable attachment to the second conductive member; and first and second sealing members, as described above, attached to the attached hinge member and the insertion hinge member for preventing passage of electromagnetic energy through the hinge.

A further precept of the invention is a joining assembly sealed against passage of electromagnetic energy for detachably, hingedly, and electrically connecting conductive members. The joining assembly comprises the sealed detachable hinge described above including first and second conductive members to be joined; the second conductive member having a slotted orifice for receiving the insertion hinge member leaf and retaining it in the plane of the slotted orifice and for making electrical contact with it. The slot may contain a seal, such as an elastomeric tubular conductive gasket which the insertion hinge member leaf encounters upon full insertion into the slot and compresses. The gasket seal them becomes the conductive medium between the insertion hinge member leaf and the second conductive member.

Other features and other attendant advantage of the invention will become more apparent upon a reading of the following detailed description together with the drawings, wherein like reference numerals refer to like parts throughout.

BRIEF DESCRIPTION OF THE DRAWING

FIG. 1 is a plane view of a piano hinge.

FIG. 2 is an end view of the hinge of FIG. 1.

FIG. 3 is a perspective view of the hinge of FIG. 1 with one leaf rotated through approximately 110 degrees.

FIG. 4 is a perspective view of an exemplary embodiment of the hinge seals of the present invention.

FIG. 5 is a perspective view of the hinge seals of the present invention as used in conjunction with the common piano hinge of FIG. 1.

FIG. 6 is a perspective view from the outside of an exemplary sealed hinge assembly.

FIG. 7 is a perspective view of the inside of the sealed hinge assembly of FIG. 6.

FIG. 8 is a detailed perspective view of the attaching hinge member of FIG. 6.

DETAILED DESCRIPTION OF THE INVENTION

Figure 9:
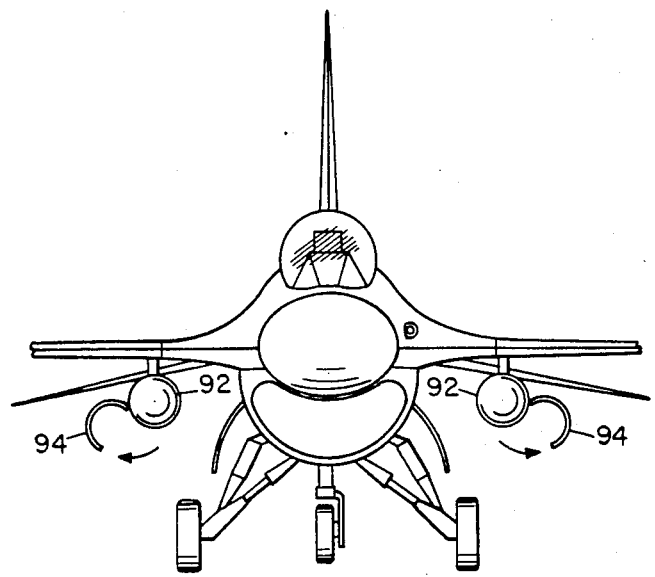
FIG. 9 is a plane view of an application of an exemplary embodiment of the present invention.

Many types of electronic equipment are housed in enclosures that are shielded to avoid passage of electromagnetic energy. Typically the entire enclosure is conductive and forms a continuous conductive shield. In many applications it is advantageous to use piano type hinges on shielded enclosures for insertion and removal of components or to gain access to repair.

With reference now to the drawing, there is shown in FIGS. 1, 2, and 3 a common prior art piano type hinge 10 such as is commonly used to hingedly join members. A first hinge member 12 is comprised of a leaf 14 and knuckle section 16. A second hinge member 18 is also comprised of a leaf 20 and knuckle section 22. The knuckle sections 16 and 22 are joined by a pivotal joining means, such as a hinge pin or pintle 24, to pivot about a common axis. FIG. 3 is a perspective view of a common piano hinge 10 illustrating the degree of movement of second hinge 18 relative to first hinge member 12. Arc "a" illustrates the total possible degree of movement of the one hinge member relative to the other. If the members to be joined by the hinge lie in the same plane, then arc "b" or arc "c" represent the degree of relative movement of the members. Arc "b" indicates the relative degree of movement when the pintle 24 is outside of the enclosure and, arc "c" represents the degree of movement when the pintle is inside the enclosure.

As seen in FIG. 1, the common piano hinge contains many aperatures 25 which would significantly compromise the shield integrity of the enclosures. Electromagnetic radiation, particularly very high frequency radiation, will pass through aperatures 25 of extremely small size. Also it is difficult to obtain both a strong, free-working hinge and one that is electrically conductive so that the members joined by the hinge are well connected electrically.

With reference now to FIGS. 4 and 5. According to the invention, first and second sealing members, shown generally as 30 and 36 respectfully consist of two strips of metal, such as hard copper alloy, shaped as shown in Figure 4. The first sealing member 30 consists of a generally planar connecting section 32 for attachment to the leaf 14 of first hinge member 12 and an arcuate section 34 for fitting over the pintle and knuckle section of the hinge 10. The second sealing member 36 also consists of a generally planar connecting section 38 for attachment to the leaf section 20 of the second hinge member 10 and an arcuate section 40. Arcuate section 40 is designed to fit tightly over the tub against the arcuate section 34 of the first sealing member. If the sealing members are made of metal such as hard copper alloy, the contact pressure and the rubbing together of the arcuate sections upon movement of the hinge assures full electrical contact along the interface. The connecting sections 32, 38 of the sealing members 30, 36 are preferably connected to their respective hinge leaf by structural conductive connecting means such as by seam (continuously) welding along their entire length.

FIG. 5 is a perspective view of the sealing members mounted on the hinge 10 of FIG. 1 to form a seal hinge 35. This configuration closes all the aperatures and prevents the leakage of electromagnetic energy through the hinge joint. Since the sealing members make intimate metal-to-metal contact with one another, a wiping action occurs and, thereby, good electric continuity throughout the length of the hinge is maintained.

Figure 11:
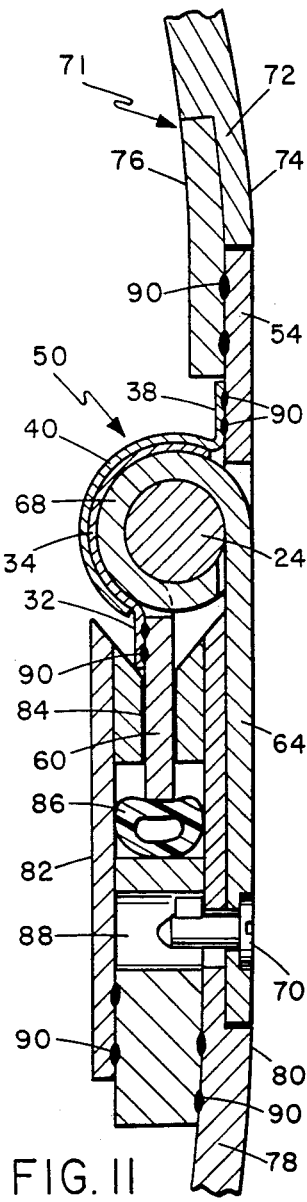
FIG. 11 is a sectional view of the detachable, sealed hinge joining assembly of the present invention taken along line 11—11 of FIG. 10.

An exemplary embodiment of a sealed hinge for detachably hingedly and electrically connecting conductive members is shown in FIGS. 6 and 7. FIG. 11 illustrates a further embodiment of the sealed hinge of FIGS. 6 and 7 in use a as a sealed, joined assembly.

With reference now to FIGS. 6 and 7, there is shown detachable sealed hinge 50 comprised primarily of attached hinge member 52, insertion hinge member 58, attaching hinge member 64, pintle 24, first sealing member 30, and second sealing member 36. The hinge members 52, 58 and 64 rotate about the common axis defined by pivotal joining means, hinge pin or pintle 24. As best seen in FIG. 8, the attaching hinge member 64 of the exemplary embodiment comprises a plurality of independent attaching hinge members comprised of a leaf 66 and knuckle section 68. Attaching member 64 could also be a continuous leaf having multiple knuckles. Fastening means such as eccentric latch screw 70, attaches the hinge assembly to one of the members to be joined. The sealing members 30, 36 are similar to and operate in the same manner as the sealing members described in FIGS. 4 and 5 above.

FIG. 11 best shows the manner is which the sealed detachable hinge 50 of FIGS. 6 and 7 is used to comprise a detachable, sealed, hinged, joining assembly 71. Such an assembly 71 can be used for detachably, hingedly, and electrically connecting conductive members. In the joining assembly 71 of FIG. 11, the detachable sealed hinge 50 of FIGS. 6 and 7 joins a first conductive member 72 to second conductive member 78. First conductive member 72 has an outside surface 74 and an inside surface 76. Structural and conductive connecting means, such as continuous seam well 90, connect the leaf 54 of attached hinge member 52 to the first conductive member to joined 72. Structural, conductive connecting means, such as continuous seam welds 90, provide structural integrity and prevent any passage of electromagnetic energy.

The second conductive member to be joined 78, having outside surface 80 and inside surface 82, contains an orifice, 84, such as a slot for reception of the leaf 60 of insertion hinge member 58. The inserted leaf 60 fits snugly into the slot 84 and thereby the second conductive member is firmly secured to the hinge in the plane of the slot 84. The second conductive member to be joined 78 contains means for attaching the attaching hinge member left 66 such as an eccentric latch groove receptacle, for receiving the eccentric latch groove 70 of the attaching hinge member leaf 66. The slot 84 contains sealing means, such as elastomeric tubular conductive gasket seal 86. The gasket seal 86 could be an elastomeric tubing impregnated with a conductive mix or enclosed in a metal wire braid. The insertion hinge member leaf 60 encounters the gasket seal 86 upon full insertion into the slot 84 and compresses and otherwise conforms the gasket seal 86 so that it is forced against the adjoining conductive structures thereby making electrical contact therewith. Likewise, there is electrical contact between the gasket seal 86 and insertion hinge leaf 60.

One of the hinge sealing members 30 is attached to the insertion hinge member 58 with structural and conductive connecting means such as continuous seam weld 90. The arcuate section 34 extends over the knuckle portion of the hinge 50. The other hinge sealing member 36 is structurally and electrically attached to the attached hinge member 52 by means such as continuous seam welds 90 on the leaf 54. The arcuate section 40 of the second sealing member 36 overlaps and fits tightly over the arcuate section 34 of the first sealing member 30 and bears against it and makes electrical contact with it. In this manner a structurally strong, sealed, detachable, hinged joining assembly is achieved. As seen in FIG. 11, this sealed hinge joining assembly 71 may be so constructed that the outside surface is essentially flush with the members to be joined. This feature is desirable in certain applications, such as where aerodynamics is a consideration.

Figure 10:
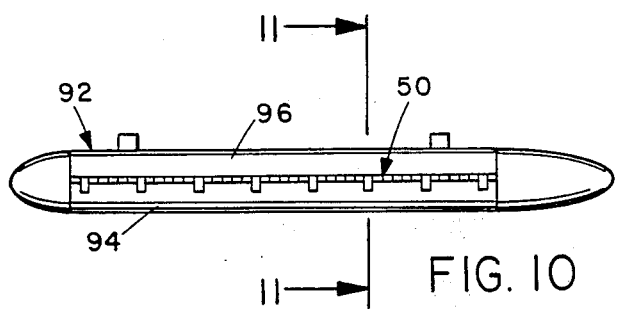
FIG. 10 is a side view of an electronic pod of FIG. 9.

An application of the joining assembly of FIG. 11 is illustrated in FIGS. 9 and 10. FIG. 9 shows an electronic enclosure, such as airplane pod 92. Many times it is desirable that such a pod be shielded against ingress or egress of electromagnetic radiation. The pod 92 is shown in side view in FIG. 10. It is desirable to open the pod to gain access for servicing and/or removal and replacement of components. To achieve this, the lower half of the pod enclosure acts as one conductive member to be joined and the upper portion 96 acts as the other member to be joined. The detachable seal hinge 50 and hinge assembly of FIG. 11 can be used to connect one or both sides of the lower pod portion 94.

In many actual use configurations, hinged members can only move one direction. For example, the pod 92 on the left in FIG. 9 is in close proximity to the air intake and the hinge has to be outboard to allow the lower pod portion 94 to be swung away adequately to allow the necessary access. In the situation a sealed hinge 35 may be used as an outboard hinge fastener. The lower pod portion 94 may be fastened on the inboard seam with any appropriate sealed fastener. The special utility of the detachable sealed hinge 50 and joining assembly of FIG. 11 is shown on the airplane pod 92 to the right in FIG. 9. Using the joining assembly 71 allows one hinge configuration to be used on both the inboard and the outboard sides of the pod 92. This allows the lower pod portion 94 to be opened on either side and is therefore applicable whether the pod is in an position such as shown at the left or the right in FIG. 9. When two joining assemblies 71 are used, the lower pod potion 94 may be easily completely separated from the upper pod portion 96. In this configuration the lower pod portion 94 acts as the second conductive member to be joined and each side has a slot 84 for insertion of the insertion hinge member 58. The fastening hinge member 64 provides a unique fastening strap for quickly attaching the lower pod 94 to the upper 96.

It can be seen that the present invention provides a hinge interface that is totally sealed to prevent the leakage of electromagnetic energy. The hinge seal is self-cleaning to maintain electrical conductivity and is flush mountable so as not to disturb aerodynamics.

The exemplary embodiment is quickly latchable and unlatchable and a single configuration can mount on either side of an aircraft equipment pod. The hinge assembly is serviceable, in that the gasket seal (the predominate wearout element) can be removed and replaced easily.

Although particular embodiments of the invention have been illustrated and described, modifications and changes will become apparent to those skilled in the art, and it is intended to cover in the appended claims such modifications and changes as come within the true spirit and scope of the invention. It is to be understood that all matter herein is to be interpreted as illustrative and not in any limiting sense.

I claim:

1. A hinge assembly sealed against passage of electromagnetic energy for detachably, hingedly and electrically connecting first and second conductive members; the second conductive member having a slotted orifice; said hinge assembly comprising:
   a conductive attached hinge member including:
      a first leaf; and
      a knuckle section; said attached hinge member leaf for structural and electrical connection to a first conductive member to be joined:
   a conductive insertion hinge member including:
      a second leaf; and
      a knuckle section; said insertion hinge member leaf for insertion into a slotted orifice in a second conductive member to be joined for retaining the insertion hinge member leaf in the plane of the slotted orifice and for making electrical contact with the second conductive member;
   a conductive attaching hinge member including:
      a leaf; and
      a knuckle portion; said attaching member leaf for removable attachment to the second conductive member;
   a first hinge sealing member of conductive material comprising;
      a connecting section for attachment to and electrical contact with said first hinge leaf; and
      an arcuate section shaped to fit over the knuckle section; and
   a second sealing member of conductive material comprising;
      a connected section for attachment to and electrical connection with the second hinge leaf; and
      an arcuate section; said arcuate sections of said first and second hinge sealing members for overlapping and making electrical contact with one another.

2. The hinge of claim 1 wherein said first and second sealing members are comprised of metal strips.

3. The hinge assembly of claim 2 wherein said first and second sealing members are comprised of copper alloy.

4. The hinge assembly of claim 1 wherein said first sealing member is seam welded to said attached leaf and wherein said second sealing member is insertion leaf.

5. The hinge assembly of claim 1 further comprising:
   slot sealing means for insertion into the slotted orifice of the second conductive member to be joined for making electrical contact between the second conductive member and said insertion leaf along its entire length.

6. The hinge assembly of claim 5 wherein said slot sealing means comprises:
   an elastomeric conductive gasket.

7. The hinge assembly of claim 1 wherein said attaching hinge member leaf includes:
   fastening means for removably fastening said leaf to the second conductive member.

8. The hinge member of claim 7 wherein said attaching leaf fastening means includes an eccentric latch screw.

9. The hinge means of claim 1 wherein said hinge assembly includes a plurality of independently hinged attaching hinge members; each of said attaching hinge members including fastening means for removably fastening each leaf to the second conductive member.

10. A joining assembly sealed against passage of electromagnetic energy for detachably hingedly, and electrically connecting conductive members; said joining assembly comprising:
   a first conductive member to be joined;
   a second conductive member to be joined; said second conductive member having a slotted orifice;
   a conductive attached hinge member including:
      a leaf; and
      a knuckle section; said attached hinge member leaf for structural and electrical connection to said first conductive member;
   a conductive insertion hinge member including;
      a leaf; and
      a knuckle section; said insertion hinge member leaf for insertion into said slotted orifice of said second conductive member; and
   a conductive attaching hinge member including;
      a leaf; and
      a knuckle portion; said attaching hinge member leaf for removable attachment to said second conductive member;

a first sealing member of conductive material comprising:
- a connection section for attachment to and electrical contact with said first hinge leaf; and
- an arcuate section shaped to fit over the knuckle sections; and a second sealing member of conductive material comprising:
- a connecting section for attachment to and electrical connection with the insertion hinge leaf; and
- an arcuate section; said arcuate sections of said first and second sealing members for overlapping and making electrical contact with one another.

11. The joining assembly of claim 10 wherein said first and second sealing members are comprised of metal strips.

12. The joining assembly of claim 11 wherein said first sealing member is seam welded to said attached hinge leaf and wherein said second sealing member is seam welded to said insertion leaf.

13. The joining assembly of claim 10 further comprising:
- a slotted orifice sealing for insertion into said slotted orifice of said second conductive member to be joined for making electrical contact between said second conductive member and said insertion leaf along its entire length.

14. The joining assembly of claim 13 wherein said slotted orifice sealing means comprises:
- a elastomeric conductive gasket.

15. The hinge assembly of claim 10 wherein said attaching hinge member leaf includes fastening means for removably fastening said leaf to said second conductive member to be joined.

16. The joining assembly of claim 10 wherein said hinge assembly includes a plurality of independent hinged attaching hinge members; each of said attaching hinge members including fastening members for removably fastening each attaching hinge member leaf to said second conductive member.

* * * * *